United States Patent [19]

Suzuki et al.

[11] Patent Number: 4,780,747
[45] Date of Patent: Oct. 25, 1988

[54] PROJECTION EXPOSURE APPARATUS

[75] Inventors: Kazuaki Suzuki, Tokyo; Hidemi Kawai, Yokohama; Hideo Mizutani, Tokyo, all of Japan

[73] Assignee: Nippon Kogaku K.K., Tokyo, Japan

[21] Appl. No.: 9,261

[22] Filed: Jan. 30, 1987

[30] Foreign Application Priority Data

Feb. 7, 1986 [JP] Japan .................................. 61-25600

[51] Int. Cl.$^4$ ...................... G03B 27/74; G03B 27/80; G03B 27/52
[52] U.S. Cl. ......................................... 355/68; 355/30; 355/53
[58] Field of Search .......................... 353/121, 122, 88; 355/30, 43, 53, 68; 350/523

[56] References Cited

U.S. PATENT DOCUMENTS

| | | | |
|---|---|---|---|
| 4,498,742 | 6/1985 | Uehara | 350/523 |
| 4,506,977 | 3/1985 | Sato et al. | 355/53 |
| 4,512,657 | 4/1985 | Sakato | 355/68 |
| 4,668,077 | 5/1987 | Tanaka | 355/30 |
| 4,687,322 | 8/1987 | Tanimoto et al. | 355/30 X |
| 4,699,505 | 10/1987 | Komoriya et al. | 355/30 |
| 4,711,568 | 12/1987 | Torigoe et al. | 355/68 |
| 4,712,910 | 12/1987 | Sakato | 355/68 X |
| 4,737,823 | 4/1988 | Bouwer et al. | 355/53 |
| 4,739,373 | 4/1988 | Nishi et al. | 355/53 |

*Primary Examiner*—Richard A. Wintercorn
*Attorney, Agent, or Firm*—Shapiro and Shapiro

[57] ABSTRACT

A projection exposure apparatus includes illuminating means for applying energy rays to a mask having a predetermined pattern formed thereon, a projection optical system for forming the image of the pattern in a predetermined projected state on a responsive substrate, adjusting means for correcting the fluctuation of the projected state of the image caused by the passage of the energy rays, exposure control means for controlling the energy rays so that the pojected image of the pattern by the projection optical system is transferred onto the responsive substrate under a predetermined exposure condition, means for making information regarding the reflectivity of the responsive substrate, and main control means for controlling the adjusting means on the basis of the predetermined exposure condition of the exposure control means and the information regarding the reflectivity.

12 Claims, 3 Drawing Sheets

F I G. 4
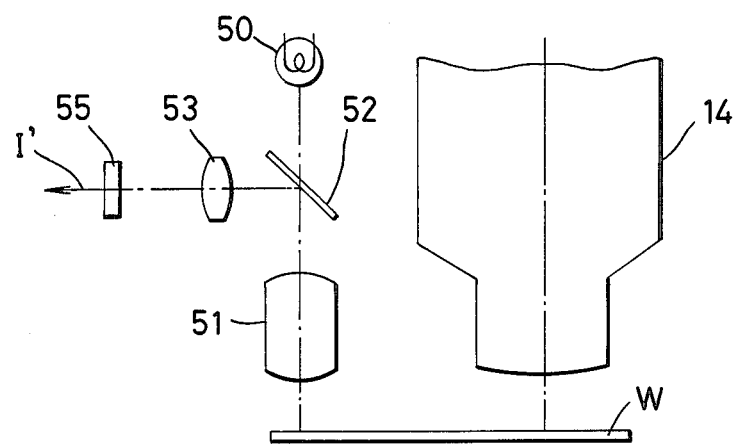
F I G. 5
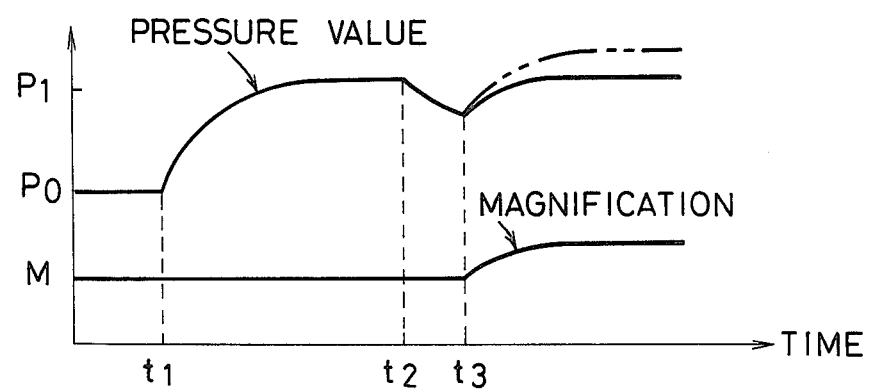

PROJECTION EXPOSURE APPARATUS

BACKGROUND OF THE INVENTION

1. Field of the Invention

This invention relates to an exposure apparatus for manufacturing semiconductors which is provided with a projection optical system, and in particular to a projection exposure apparatus provided with a detecting device for detecting the reflectivity of a semiconductor wafer placed on a stage.

2. Related Background Art

In a projection exposure apparatus for producing semiconductor devices such as super-LSI by the photolithograph including the step of projecting the image of a pattern on a photomask or a reticle onto a semiconductor wafer having photoresist applied thereto at a predetermined magnification by the use of a projection lens, matching accuracy is mentioned as one of the important performances thereof. One of important factors which affect the matching accuracy is the magnification error of the projection optical system. The size of the pattern used in super-LSI is in the tendency toward minuteness and correspondingly, the requirement for the improved matching accuracy on the wafer is strengthening. Accordingly, the necessity of keeping the projection magnification at a predetermined value has become very high. Now, the magnification of the projection optical system is fluctuated in the vicinity of a predetermined magnification by a slight variation in the temperature of the apparatus, a slight fluctuation of the barometric pressure of the atmosphere in the clean room and the application history of energy rays to the projection optical system. For this reason, projection exposure apparatuses provided with a magnification correcting mechanism for finely adjusting the magnification of the projection optical system and realizing the predetermined magnification have recently made their advent. Specifically, magnification correcting mechanisms which vary the spacing between an object (reticle) and the projection lens, or change the lens spacing in the projection lens or adjust the pressure in a particular air chamber in the projection lens are known. Also, the focus (the position of the imaging plane) is moved due to the same fluctuation factors as the fluctuation factors regarding the magnification and therefore, projection exposure apparatuses having a focus correcting mechanism have also recently made their advent.

Now, among the aforementioned fluctuation factors of the imaging characteristic, as regards the influence of the application of energy rays to the projection optical system, the image of the pattern can be controlled to a predetermined state of projection by a method of adjusting the pressure in the projection lens in confirmity with the application history, as disclosed, for example, in Japanese Laid-Open Patent Application No. 78454/1985 which corresponds to U.S. application Ser. No. 656,777 filed on Oct. 1, 1984 and already allowed. However, this method takes into account only the influence of the exposure light from the light source entering the projection lens and does not at all takes into account the influence imparted to the projection lens by the reflected light reflected on the wafer and again entering the projection lens. That is, the quantity of energy rays transmitted through the projection lens and contributing to the imaging can be easily measured on the basis of the exposure conditions determined by the application time, the application intensity and the transmittivity of the reticle, but the quantity of energy rays returned to the projections lens by the reflection on the imaging plane cannot be measured, and this has led to the disadvantage that any variation in the reflectivity of the object (the wafer or the like) positioned on the imaging plane would cause the controlled imaging characteristic to deviate from a predetermined state.

This will now be described by reference to FIG. 5 of the accompanying drawings. FIG. 5 shows the variations with time in the magnification on the wafer and the control pressure value during the pressure adjustment of the air chamber in the projection lens. It is to be understood that during time $t_1$ to time $t_2$, wafers of low reflectivity are successively exposed and from time $t_3$, wafers of high reflectivity are exposed. Assuming that with regard to the wafers of low reflectivity, the quantity of energy rays (reflected light) returning to the projection lens is small and the influence thereof upon pressure control is negligible, the pressure value varies from $P_0$ to $P_1$ during time $t_1$ to time $t_2$ and is saturated at $P_1$. During time $t_2$ to time $t_3$, no exposure is effected and therefore the pressure value gradually lowers from $P_1$. Thereby, until time $t_3$, the magnification of the projected image on the wafer is accurately controlled to a predetermined value M. Assuming that from time $t_3$, exposure is effected under the same conditions as the previous wafers, the pressure value varies so as to be again saturated at $P_1$. In this case, however, the quantity of energy rays is increased and therefore, under the influence of the reflected light thereof, the magnification deviates from the predetermined value M. Such a disadvantage has been found to reside in the aforedescribed projection exposure apparatus according to the prior art.

On the other hand, in a projection exposure apparatus, with the tendency of the patterns of semiconductor devices toward minuteness and higher integration, higher alignment accuracy as well as proper exposure control complementary to the sensitivity and thickness of the photoresist on the wafer is necessary. Heretofore, this exposure control has been designed by providing a shutter and the light-receiving portion of an integrating photometering device in the illuminating system so that the shutter is closed when a proper quantity of light has entered the light-receiving portion from an exposure light source. However, in such prior-art exposure control apparatus, which is of the type which detects the exposure light from the light source, exposure correction is possible for the fluctuation of the intensity of the exposure light, but the exposure correction for the difference in the photoresist on the wafer, particularly in the thickness thereof, cannot be accomplished, and this has led to the undesirable possibility that defect is created in the printed pattern.

SUMMARY OF THE INVENTION

It is a first object of the present invention to provide an improved projection exposure apparatus which can maintain a more stable state of projection than the prior-art projection exposure apparatus for the fluctuation of the magnification of the projection optical system and the fluctuation of the position of the imaging plane which may occur due to exposure.

It is a second object of the present invention to provide a projection exposure apparatus which can always keep the state of projection (magnification and focus position) by the projection optical system in a predetermined state even if the reflectivity of an object (a wafer or the like) placed on a stage varies.

It is a third object of the present invention to provide a reflected light detecting device suitable for detecting the reflected light of the exposure light projected through a projection lens from an object, through the projection lens, and finding the reflectivity of the surface of the object.

It is a fourth object of the present invention to provide a projection exposure apparatus having an exposure control device which is capable of accomplishing proper exposure even if the state of the photoresist on a wafer changes.

According to an embodiment of the present invention, it is a technical gist to provide an energy detector for detecting the quantity of reflected light from a responsive substrate to be exposed, thereby highly accurately detecting the amount of fluctuation of the imaging characteristic caused, for example, by application of energy rays to the projection optical system, irrespective of any variation in the reflectivity of the substrate, and preferably controlling the state of projection to a predetermined state.

In the characteristic graph shown in FIG. 5, to restore the magnification to the predetermined value M, it has become apparent from various experiments that the pressure value may be rendered as indicated by a phanoom line in which more intense control works than in the solid line.

The energy detector for coping with the aforementioned fluctuation of the imaging characteristic is provided at a position conjugate with the pupil of the projection optical system, or in a wafer global alignment optical device or a prealignment optical device juxtaposed near the projection optical system. This energy detector detects the reflected light from a fiducial mark plate of known reflectivity provided on the stage and the reflected light from the surface of the wafer and supplies the detected photoelectric outputs to a main control unit. The reflectivity of the surface of the wafer is operated in the main control unit on the basis of the photoelectric outputs corresponding to the reflected lights from the fiducial mark plate and the surface of the wafer, and with the found reflectivity added, the fluctuation of the imaging performance of the projection optical system is corrected.

Further, in a projection exposure apparatus wherein the energy detector is disposed at the position conjugate with the pupil of the projection optical system so that the reflected light based on the exposure light projected from the projection optical system is detected through the projection optical system, any variation in the reflected light on the photoresist applied to the wafer can be detected during exposure. During this exposure, it is possible to detect the progress and state of the variation in the reflectivity of the photoresist, determine the closing time of a shutter and control the shutter so that proper exposure conforming to the photosensitivity and thickness of the photoresist is automatically effected.

According to the present invention, design is made such that the reflectivity of the responsive substrate can be measured, and this leads to the obtainment of the effect that the amount of fluctuation of the state of projection by the incidence of the exposure light onto the projection optical system can be estimated more accurately. Also, the closing time of the shutter can be controlled in conformity with any variation in the reflectivity of the responsive substrate to thereby enable proper exposure conforming to the photoresist on the substrate to be accomplished, thereby improving the printing accuracy.

The present invention will become more fully apparent from the following detailed description taken in conjunction with the accompanying drawings.

BRIEF DESCRIPTION OF THE DRAWINGS

FIG. 4 shows the construction of another embodiment of the reflectivity measuring optical system according to the present invention.

FIG. 5 is a characteristic graph showing the variations with time in the fluctuation correction and magnification of the projection optical system.

DESCRIPTION OF THE PREFERRED EMBODIMENTS

Figure 1:
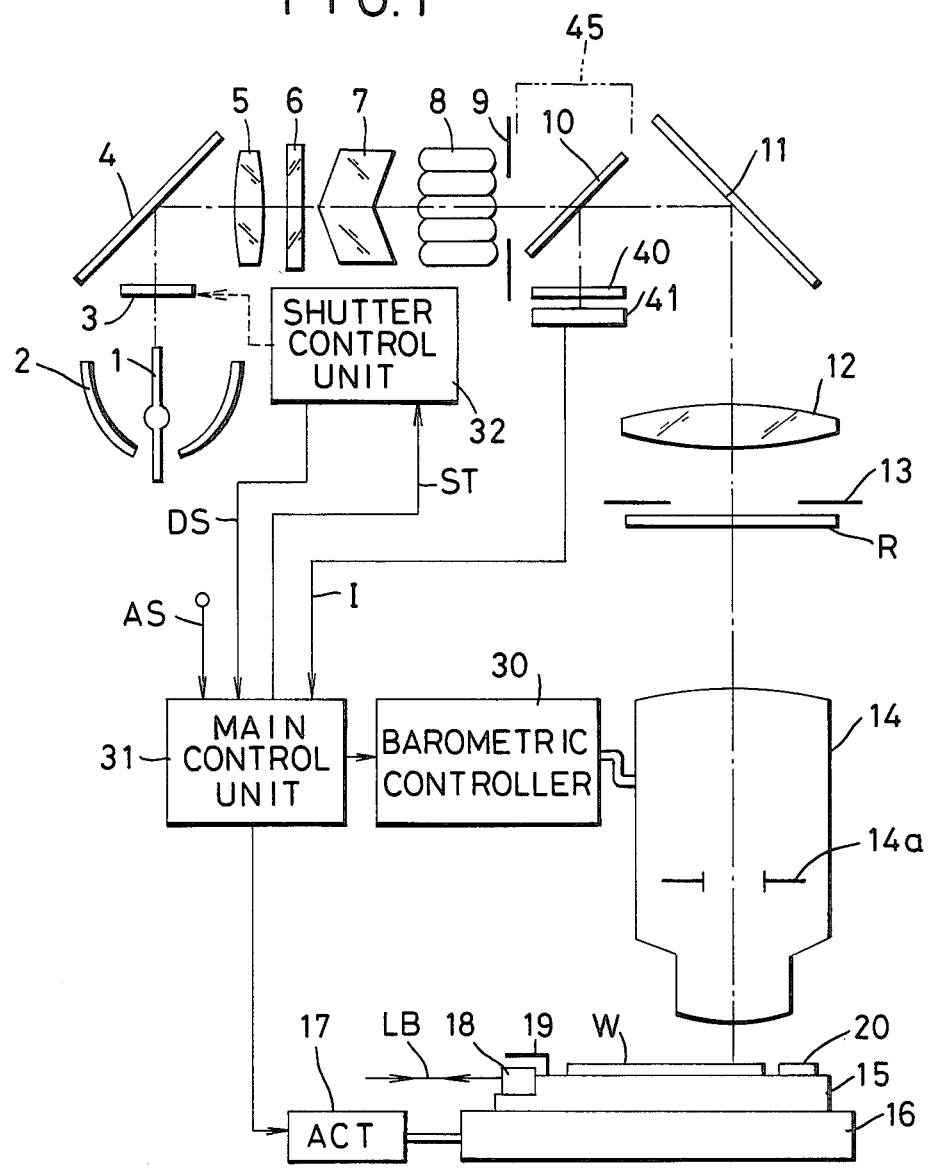
FIG. 1 is a schematic view showing a projection exposure apparatus according to a first embodiment of the present invention.

Referring to FIG. 1 which shows a first embodiment of the present invention, the illuminating light from a mercury lamp 1 is condensed by an elliptical mirror 2, passes through a shutter 3 and is reflected by a dichroic mirror 4. The illuminating light is then collimated by a collimator lens 5, passes through a filter 6 which selects only the exposure wavelength (for example, g-line), and enters a cone prism 7 and an optical integrator 8 in the named order. A number of secondary light source images are formed on the exit surface of the optical integrator 8, and an aperture stop 9 is disposed near said exit surface. The illuminating optical system including the cone prism, the optical integrator and the aperture stop is shown in U.S. Pat. No. 4,498,742.

The exposure light having emerged from the aperture stop 9 enters a dichroic mirror 11 via a mirror 10 of high transmittivity and low reflectance, is reflected by the dichroic mirror 11, is formed into a uniform intensity distribution by a condenser lens 12 and irradiates a reticle R. An illumination aperture stop (so-called reticle blind) 13 shields from light the pattern portion on the reticle R which should not be exposed, in any shape. The exposure light transmitted through the exposure pattern portion of the reticle R enters a projection lens 14, and the projected image of the pattern is formed on a wafer W. Designated by 14a is the pupil of the projection lens 14. The wafer W is placed on a Z stage 15 which is provided on an XY stage 16 for vertical movement (movement in the direction of the optical axis of the projection lens 14). The XY stage 16 is two-dimensionally moved in parallelism to the projection imaging surface of the projection lens 14 by a drive unit 17 including a motor.

Now, a movable mirror 18 for vertically reflecting the laser beam LB from a laser interferometer (not shown) for detecting the two-dimensional position of the XY stage 16 (or the wafer W) is fixed to the Z stage 15. Disposed above the movable mirror 18 is a light intercepting plate 19 fixed so as not to be in direct contact with the movable mirror 18. The light intercepting plate 19 serves to prevent the exposure light passed through the projection lens 14 from being applied to the movable mirror 18 and warming the movable mirror 18, and the upper surface thereof is designed with a relatively low reflectivity. A fiducial mark plate 20 of very high reflectance provided with a fiducial mark for providing the reference during various kinds of alignment is provided on the Z stage 15.

Now, in the present embodiment, a barometric controller 30 is provided as means for adjusting the projecting condition of the projection lens 14, whereby the imaging characteristics (magnification and focus position) of the projection lens 14 itself can be finely controlled. The construction of the barometric controller 30 is disclosed in detail in the aforementioned U.S. application Ser. No. 656,777 filed on Oct. 1, 1984. The barometric controller 30 receives as an input from a main control unit 31 including a memory and an operating position a pressure control value which can from moment to moment correct the fluctuation of the imaging characteristics of the projection lens 14 caused by the transmission of the exposure light therethrough, and is responsive to said pressure control value to control the pressure of the selected air space (air chamber) in the projection lens 14. The main control unit 31 provides an opening signal ST to a shutter control unit 32 which controls the opening-closing operation of the shutter 3 and the exposure time, and also receives as an input from the shutter control unit 32 a signal DS corresponding to the duty of the opened state and closed state of the shutter 3 in a unit time (e.g. 5 seconds). Also, the main control unit 31 receives environmental information (the value of the atmospheric pressure and the value of the temperature) AS as an input and estimates the amount of fluctuation of the magnification and the amount of fluctuation of the focus of the projection lens 14 caused by the incidence of the exposure light thereon, on the basis of the signal DS from the shutter control unit 32, and determines the pressure control value for correcting these amouns of fluctuations, with the environmental information AS added thereto.

On the other hand, a filter 40 for selectively transmitting the wavelength of the exposure light therethrough and a photoelectric detector 41 are provided at positions substantially symmetrical with the exit surface of the optical integrator 8 with respect to the mirror 10. The exit surface of the optical integrator 8 (or the aperture stop 9) is conjugate with the pupil 14a of the projection lens 14 with respect to the condenser lens 12, and the mirror 10 is disposed near the position conjugate with the pupil 14a. The mirror 10 may be mere elementary glass, or a mirror having the side thereof adjacent to the optical integrator 8 coated for antireflection and the side thereof adjacent the projection lens 14 left as elementary glass, or a mirror having the side thereof adjacent to the integrator 8 coated for antireflection and the side thereof adjacent to the projection lens made into a half-mirror. It is desirable that the light-receiving surface of the photoelectric detector 41 be in a conjugate relationship with the pupil 14a. That is, the distance from the center of the mirror 10 to the optical integrator 8 is made optically equal to the distance from the center of the mirror 10 to the light-receiving surface, and the size of the light-receiving surface of the photoelectric detector 41 is made equal to or larger than the size of the image of the pupil 14a on the light-receiving surface. Also, besides the construction as shown in FIG. 1, a lens system may be inserted between the mirror 10 and the photoelectric detector 41 to cause the pupil 14a to be re-imaged on the light-receiving surface of the photoelectric detector 41.

Now, in the construction as described above, the reflected lights from the condenser lens 12, the reticle blind 13, the reticle R, the internal lens element of the projection lens 14 and the object, particularly the wafer W, positioned in the projection field enter the photoelectric detector 41 in superposed relationship with one another. Generally, unexposed photoresist is applied to the surface of the wafer W and fine unevenness is present on said surface with the progress of the process. Therefore, besides the regular reflected light of the exposure light, scattered diffracted light is produced on the surface of the wafer W and travels back to the projection lens 14 with the regular reflected light. Thus, as the light-receiving surface of the photoelectric detector 41 is larger than the size of the image of the pupil 14a formed thereon, more reflected light (the reflected light passing through the projection lens 14) including the scattered diffracted light can be detected. In that case, the filter 40 must also be in accord with the size of the photoelectric detector 41.

In FIG. 1, preferably, a light trap 45 may be provided above the mirror 10 to prevent part of the exposure light having emerged from the optical integrator 8 from being reflected above the mirror 10 and reflected by a metallic member such as a partition wall, not shown, and entering the photoelectric detector 41 as stray light. However, if the reflectance measuring method to be described is carried out, the light trap 45 may be dispensed with. Further, a photometering element for operating the shutter control unit 32 in the mode of integrating the quantity of light may be provided at the position where at the light trap 45 is disposed.

The reflectivity measuring method according to the present embodiment will now be described. If, as shown in FIG. 1, the mirror 10 for directing reflected light to the photoelectric detector 41 is provided in the optical path of the illuminating optical system, the reflected lights from the condenser lens 12 and the pattern (chromium portion) of the reticle R, in addition to the reflected light from the surface of the wafer W, are received in a form added as offset. So, projection of the pattern of the reticle R is effected at two locations of different reflectivities (hereinafter referred to as the points A and B) of the outside portion of the Z stage 15 on which the wafer W is not placed, and a photoelectric output Ia corresponding to the quantity of reflected light received at the point A and a photoelectric output Ib corresponding to the quantity of reflected light received at the point B are pre-measured, whereby the reflectivity Rw of the wafer W for the exposure light is found in a form in which said offset is offset. For this purpose, in the present embodiment, it is to be understood that the point A is the surface of the fiducial mark plate 20 of high reflectivity and the point B is the surface of the light-intercepting plate 19 of low reflectivity, and that the reflectivity Ra of the point A for the exposure light and the reflectance Rb of the point B for the exposure light (Rb<Ra) are pre-measured by discrete methods and stored in the memory of the main control unit 31.

The reticle R is first set and the reticle blind 13 is set to a predetermined shape and size, whereafter the XY stage 16 is positioned so that the fiducial mark plate 20 is positioned within the projection field of the projection lens 14. The main control unit 31 opens the shutter 3 and projects the pattern of the reticle R onto the fiducial mark plate 20 and also reads the photoelectric output I of the photoelectric detector 41, and the magnitude thereof is stored as Ia in the memory of the main control unit 31. Of course, the surface dimensions of the fiducial mark plate 20 are larger than the dimensions of the projected image of the pattern. Subsequently, the XY stage 16 is moved to project the pattern of the reticle R onto the light-intercepting plate 19, and the then photoelectric output I is read and the magnitude thereof is stored as Ib. Thereafter, on the basis of the photoelectric output I, interpolation or exterpolation is effected by the following equation (1), whereby the reflectivity Rw of the wafer W is calculated.

$$Rw = Rb + \left(\frac{I - Ib}{Ia - Ib}\right) \cdot (Ra - Rb) \tag{1}$$

Figure 2:
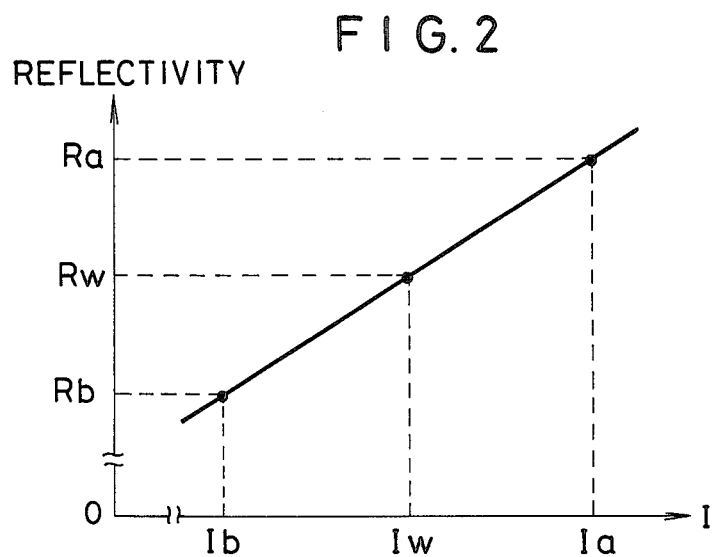
FIG. 2 is a graph for illustrating a method of measuring the reflectivity of a semiconductor wafer in the embodiment of FIG. 1.

This equation (1) is graphically shown in FIG. 2, wherein the abscissa represents the photoelectric output I and the ordinate represents the reflectivity. In FIG. 2, Iw is the magnitude of the photoelectric output I when exposure is effected with the wafer W being positioned in the projection field. In the present embodiment, measurement of the reflectivity Rw is possible during each exposure shot at which the wafer W is exposed by the step-and-repeat system.

Now, when the reflectivity Rw of the wafer W has been found, the main control unit 31 corrects the pressure control value in conformity with the reflectivity Rw. For example, the pressure control value (primarily corresponding to the amount of fluctuation of the imaging characteristic) obtained when the reflectivity of the object in the projection field is zero is corrected so as to be $(1+Rw)$ times. Thereby, the error in control caused by the reflectivity of the wafer W being not constant is markedly reduced.

Also, the detection of the photoelectric outputs Ia and Ib using the points A and B is effected each time the reticle R changes, that is, each time the size (or the shape) of the reticle blind 13 is changed. Further, it is desirable that the detection of the photoelectric outputs Ia and Ib be effected also every predetermined time in conformity with the reduction in the illumination of the mercury lamp 1.

Figure 3:
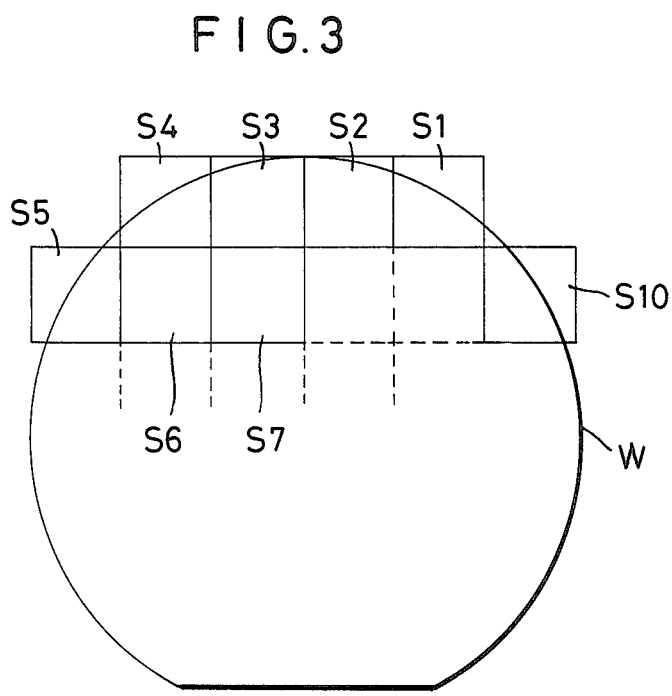
FIG. 3 shows the arrangement of exposure shots on the semiconductor wafer in the embodiment of FIG. 1.

Now, in the construction as shown in FIG. 1, unless the actual exposure of the wafer W is started, the reflectivity Rw cannot be found, and accurate reflectivity Rw is not always obtained from the first shot to the wafer W. That is, consider a case where as shown in FIG. 3, shots $S_1$, $S_2$, $S_3$ and $S_4$ are successively exposed from the right upper on the wafer W to the left and then shots $S_5$, $S_6$, $S_7$, ..., $S_{10}$ are successively exposed from the left to the right in the lower row. The shots $S_1$, $S_4$, $S_5$ and $S_{10}$ considerably protrude from the outer periphery of the wafer W and therefore, the reflectivity measured in these shots is inaccurate. The shots $S_2$ and $S_3$ slightly protrude from the outer periphery of the wafer W and therefore, the reflectivity measured in these shots lacks in accuracy, but the area thereof which protrudes is slight and therefore, the reflectivity is measured with such a degree of accuracy that the error is practically allowable. The shots $S_6$ and $S_7$ are included within the wafer W and therefore, in these shots, measurement values of high reliability can be obtained. The shots $S_1$, $S_4$, $S_5$ and $S_{10}$ protruding greatly and the shots $S_6$ and $S_7$ included with the wafer, as shown in FIG. 3, can be easily distinguished from each other from the design value of the shot arrangement during the step-and-repeat exposure. So, the main control unit 31 uses only the reflectivity Rw measured during the exposure of the shots included within the wafer W and successively averages the measured reflectivities each time the exposure progresses, and effects processing by regarding the average reflectivity at the point of time whereat the exposure of the first wafer W has been terminated as the reflectivity of the second and subsequent wafers (the wafers subjected to the same process as the first wafer). Alternatively, regarding the protruding shots, the reflectivity may be calculated with the weighting changed in conformity with the amount of protrusion thereof and the average value with respect to all the shots may be found. What is important in the barometric control is only the variation in the quantity of reflected light from the wafer W and not the reflectivity itself and therefore, whether or not the shots protrude from the configuration of the wafer, the reflectivity Rw found in FIG. 2 may be regarded as the quantity of reflection and may intactly be used for correction.

Now, when as in the above-described first embodiment, the reflected light from the wafer W resulting from the exposure light is to be detected through the projection lens 14, it is necessary to take it into account that the reflection characteristic of the wafer W by the exposure light is greatly governed by the characteristic of photoresist. The ordinary photoresist is determined so that the opto-chemical response thereof to the wavelength of the exposure light is of the highest sensitivity. This means that immediately after the exposure light has irradiated the photoresist, the photoresist absorbs the exposure light and as the opto-chemical response progresses, the absorbing property disappears, that is, the photoresist has the characteristic that as the exposure progresses, the reflectivity becomes greater. This variation in the reflectivity differs depending on the illumination of the exposure light per unit area, the quality and thickness of the photoresist and the sensitivity of the photoresist. Accordingly, in the measurement of the reflectivity Rw by the exposure light, in FIG. 1, for example at the completion of the opening of the shutter 3, the photoelectric output I may be rapidly sampled at the midpoint within the exposure time (the shutter full open time) and at the start of the closing operation of the shutter 3, and the reflectivities found at the various sampling points may be averaged. Alternatively, the reflectivities found by rapidly sampling the photoelectric output I of the photoelectric detector 41 at the completion of the opening of the shutter 3 and at the start of the closing operation of the shutter 3 may be averaged, or the reflectivity may be found by sampling the photoelectric output I at the midpoint within the exposure time (the shutter full open time). As a further alternative, the average reflectivity may be found by integrating the photoelectric output I within the exposure time (the shutter full open time).

Also, where as in the first embodiment, the photoelectric detector 41 receives the reflected light from the exposed area on the wafer W by the projection lens 14, if the variation in the photoelectric output I after the shutter 3 has been opened is detected and control is effected by the utilization of the chracteristic of said photoresist so that the closing operation of the shutter 3 is started when the photoelectric output I exhibits a predetermined variation, so-called exposure amount control will be possible. Such exposure amount control is advantageous in that because the process of sensitization of the photoresist can be grasped on real time, the over-exposure and under-exposure by the influence of the ground of the photoresist can be reduced.

FIG. 4 shows a reflection quantity measuring portion according to a second embodiment of the present invention. Where as shown in FIG. 4, for example, a microscope for wafer global alignment or a magnifying optical system for prealignment is provided at a location distant from the projection lens 14, many of those optical systems have an illuminating light source 50 and an objective lens 51. So, a half-mirror 52 and a lens 53 are provided and the quantity of reflected light of the illuminating light by the wafer W is received by a photoelectric detector 55. The photoelectric output I' of this photoelectric detector 55 is supplied to the main control unit 31 as in the first embodiment of FIG. 1. Again in this case, it is more accurate to find the reflectivity of the wafer W (the photoelectric output Iw) after two-point measurement at the points A and B has been effected. Also, when the wavelength of the illuminating light from the illuminating light source 50 differs from the wavelength of the exposure light, the behavior of the reflection characteristic of the photoresist also differs and therefore, it is necessary to effect correspondence in advance between the reflectivity for the illuminating light and the reflectivity for the exposure light.

Also, in the second embodiment, the exposure time by the shutter 3 is controlled on the basis of a detection signal obtained by directly detecting the exposure light by means of a detector which is provided discretely.

In any of the two embodiments of the present invention described above, a system which corrects the imaging characteristic of the projection lens 14 itself by barometric control has been illustrated as the means for adjusting the state of projection. However, when only the fluctuation of the focus of the projection lens 14 caused by the incidence of the exposure light is to be corrected, the level of the Z stage 15 may be automatically adjusted so that the fluctuation is corrected in conformity with the amount of fluctuation estimated by the main control unit 31 on the basis of the signal DS. In this case, the Z stage 15 is included in the adjusting means of the present invention. Besides this, a mechanism capable of varying the spacing between the reticle R and the projection lens 14 or a mechanism capable of moving a particular lens element in the projection lens 14 (for example, the lens nearest to the reticle R) in the direction of the optic axis may be intactly applied as the adjusting means of this type.

Also, the reflectivity (the quantity of reflection) Rw measured by the photoelectric detector 41 may only be indicated to the operator and whether the reflectivity Rw should be added during the correction of the fluctuation of the state of projection or whether the indicated reflectivity Rw should be modified from the operator's experience may be left to the operator's judgment.

What we claim is:

1. A projection exposure apparatus including:
   illuminating means for applying energy rays to a mask having a predetermined pattern formed thereon;
   a projection optical system for forming the image of said pattern in a predetermined projected state on a responsive substrate;
   adjusting means for correcting the fluctuation of the projected state of said image caused by the passage of said energy rays;
   exposure control means for controlling said energy rays so that the projected image of said pattern by said projection optical system is transferred onto said responsive substrate under a predetermined exposure condition;
   means for making information regarding the reflectivity of said responsive substrate; and
   main control means for controlling said adjusting means on the basis of said predetermined exposure condition of said exposure control means and said information regarding the reflectivity.

2. A projection exposure apparatus according to claim 1, wherein said information making means includes a detector provided at a position conjugate with the pupil of said projection optical system so as to receive said energy rays reflected from said responsive substrate and again entering said projection optical system and produce a corresponding output.

3. A projection exposure apparatus according to claim 2, wherein said exposure control means includes a shutter provided in the path of the energy rays from said illuminating means, and shutter control means responsive to the output of said cetector to close said shutter.

4. A projection exposure apparatus according to claim 1, further including detecting means having a projection optical system provided in juxtaposed relationship with said projection optical system for projecting the light from a light source discrete from said illuminating means onto said responsive substrate, and a detector for receiving the reflected light from said responsive substrate through said second-mentioned projection optical system, said main control means being responsive to said detecting means to determine the reflectivity of said responsive substrate.

5. A projection exposure apparatus including:
   illuminating means for applying energy rays to a mask having a predetermined pattern formed thereon;
   a projection optical system for forming the image of said pattern on a responsive substrate;
   a fiducial member having a predetermined reflectivity provided on a stage on which said responsive substrate is placed;
   an energy ray detector disposed at a position conjugate with the pupil of said projection optical system to detect the energy rays emitted from said projection optical system and thereafter again entering said projection optical system and produce a detection output; and
   means for determining the reflectivity of said responsive substrate on the basis of the detection output from said energy ray detector.

6. A projection exposure apparatus according to claim 5, wherein said fiducial member includes a first fiducial member having a relatively high reflectivity and a second fiducial member having a relatively low reflectivity and wherein said apparatus further includes means for moving said projection optical system to first and second positions opposed to said first and second fiducial members, respectively.

7. A projection exposure apparatus comprising:
   means for generating an energy beam applied to an object;
   a movable stage for supporting a substrate thereon;
   a projection optical system provided between said object and said substrate to form the image of said object on said substrate;

a fiducial member provided on said movable stage and having a surface of a predetermined reflectivity;

means for moving said movable stage between positions including at least a first position at which a part of said substrate is located in the projection field of said projection optical system and a second position at which the surface of said fiducial member is located in said projection field;

an energy beam detector disposed at a position substantially conjugate with the pupil of said projection optical system on the side opposite to said movable stage with respect to said projection optical system for producing a detection output; and means for making information regarding the reflection of said energy beam on said substrate on the basis of said detection output produced when said movable stage is in said first position and said second position.

8. A projection exposure apparatus according to claim 7, wherein said energy beam detector has a detecting surface having a size equal at least to the image of the pupil of said projection optical system on said detecting surface.

9. A projection exposure apparatus according to claim 7, wherein said energy beam detector receives said energy beam reflected by a portion of said substrate and again entering said projection optical system when said movable stage is in said first position, and receives said energy beam reflected by the surface of said fiducial member and again entering said projection optical system when said movable stage is in said second position.

10. A projection exposure apparatus including:

illuminating means for applying energy rays to a mask having a predetermined pattern formed thereon;

a projection optical system for forming the image of said pattern in a predetermined projected state on a responsive substrate;

adjusting means for correcting the fluctuation of the projected state of said image caused by the passage of said energy rays;

means for making information regarding the reflectivity of said responsive substrate; and main control means for controlling said adjusting means on the basis of said information regarding the reflectivity.

11. A projection exposure apparatus comprising:

holder means for supporting an object;

stage means for supporting a substrate;

a projection optical system provided between said holder means and said stage means to form the image of said object on said substrate;

a photodetector provided on the side opposite to said stage means with respect to said projection optical system and having a light-receiving surface; and optical means provided between said projection optical system and said photodetector to render the light-receiving surface of said photodetector conjugate with the pupil of said projection optical system.

12. A projection exposure apparatus according to claim 11, wherein the light-receiving surface of said photodetector is of a size equal at least to the image of the pupil of said projection optical system on said light-receiving surface.

* * * * *